United States Patent
Liu et al.

(10) Patent No.: US 7,916,262 B2
(45) Date of Patent: Mar. 29, 2011

(54) SIGNAL TRANSMISSION ASSEMBLY AND DISPLAY DEVICE APPLIED WITH THE SAME

(75) Inventors: Po-Yuan Liu, Hsinchu (TW); Chuan-Mau Wei, Jhudong Township, Hsinchu County (TW); Kuo-Chih Lee, Sinhua Township, Tainan County (TW)

(73) Assignee: Au Optronics Corp., Hsinchu (TW)

( * ) Notice: Subject to any disclaimer, the term of this patent is extended or adjusted under 35 U.S.C. 154(b) by 1116 days.

(21) Appl. No.: 11/650,469

(22) Filed: Jan. 8, 2007

(65) Prior Publication Data

US 2007/0268441 A1 Nov. 22, 2007

(30) Foreign Application Priority Data

May 18, 2006 (TW) .............................. 95117715 A

(51) Int. Cl.
*G02F 1/1345* (2006.01)
(52) U.S. Cl. ........................ 349/150; 349/142; 349/152
(58) Field of Classification Search .................. None
See application file for complete search history.

(56) References Cited

U.S. PATENT DOCUMENTS

| 5,375,003 A * | 12/1994 | Hirai .............................. 349/187 |
| 5,893,623 A | 4/1999 | Muramatsu |
| 5,914,763 A | 6/1999 | Fujii et al. |
| 6,083,666 A | 7/2000 | Kim |
| 6,213,789 B1 | 4/2001 | Chua et al. |
| 6,542,213 B1 | 4/2003 | Uchiyama |
| 6,601,947 B1 * | 8/2003 | Sato et al. ........................ 347/68 |
| 6,822,720 B2 | 11/2004 | Ueda et al. |
| 7,023,095 B2 | 4/2006 | Lee et al. |
| 2001/0033355 A1 * | 10/2001 | Hagiwara ...................... 349/152 |
| 2006/0103788 A1 * | 5/2006 | Kurosawa et al. ............. 349/110 |

FOREIGN PATENT DOCUMENTS

| CN | 1558270 A | 12/2004 |
| JP | 64-028621 | 1/1989 |
| JP | 07-161765 | 6/1995 |
| JP | 2602237 | 4/1997 |
| JP | 2005-019625 | 1/2005 |
| TW | 549581 | 8/2003 |
| TW | I236068 | 7/2005 |

* cited by examiner

*Primary Examiner* — Tina M Wong
(74) *Attorney, Agent, or Firm* — Rabin & Berdo, P.C.

(57) ABSTRACT

A signal transmission assembly includes first and second substrates respectively having first and second electrodes, and a conductive layer disposed between the electrodes. The second electrode has a trench. The conductive layer includes an adhesive and conductive particles distributed therein. The second electrode is electrically connected to the first electrode through the conductive layer, and a portion of the adhesive is filled into the trench. When the assembly is applied to a display device, the first electrode electrically connects a non-display area to a display area of a display panel. When the second electrode and a third electrode at two ends of the second substrate are electrically connected to the first electrode and a third substrate (e.g., a PCB), respectively, a signal may be transmitted from the third substrate to the display area through the second substrate, the second electrode and the first electrode to control the display.

33 Claims, 13 Drawing Sheets

SIGNAL TRANSMISSION ASSEMBLY AND DISPLAY DEVICE APPLIED WITH THE SAME

This application claims the benefit of Taiwan application Serial No. 95117715, filed May 18, 2006, the subject matter of which is incorporated herein by reference.

BACKGROUND OF THE INVENTION

1. Field of the Invention

The invention relates in general to a signal transmission assembly and a display device applied with the same, and more particularly to a signal transmission assembly capable of enhancing overflowing adhesive uniformity and increasing the bonding intensity, and a display device applied with the same.

2. Description of the Related Art

In a module process of a liquid crystal display, a display panel and a PCB (Print Circuit Board) are connected to each other through a FPC (Flexible Print Circuit) or a TCP/TAB (Tape Carrier Package/Tape Automated Bonding) to achieve the object of transmitting signals. In order to slim the display, the newest COF (Chip On Film) technology reduces the peripheral area of the panel, which is required during the bonding process, such that the display can be applied to a notebook computer, which has to be made slim and light. Although the package methods are different from one another, most of the lead electrode portions of the film substrates are electrically connected to metal conductive bonding pads at one end of the display panel (or one end of the PCB) through an ACF (Anisotropic Conduction Film) after being hot-pressed.

FIG. 1 is a schematic illustration showing a display device in which a PCB is connected to a display panel through a FPC. Referring to FIG. 1, the display panel includes a display area 1 and a non-display area 2. The display panel includes a first substrate 11 having a first electrode 13 formed thereon. The first electrode 13 is located in the non-display area 2 and electrically connected to the display area 1. The display panel also has a second substrate 21, such as a FPC, for connecting the first substrate 11 of the display panel to a third substrate 31, such as a PCB, in order to transmit signals. The first electrode 13 is the conventional metal conductive bonding pad and may be formed by a metal layer on the first substrate 11 and an ITO (Indium Tin Oxide) layer on the metal layer.

As shown in FIG. 1, two ends of the second substrate 21 respectively have a second electrode 22 and a third electrode 23, which pertain to the conventional leads. In addition, conductive layers, such as a first ACF 41 and a second ACF 42, are disposed between the first electrode 13 and the second electrode 22, and between the third electrode 23 and the third substrate 31. The ACF mainly includes an adhesive and numerous conductive particles distributed in the adhesive. After being hot-pressed in the direction as indicated by the arrow, two ends of the second substrate 21 may be electrically connected to the first substrate 11 and the third substrate 31, respectively, so that the signals can be transmitted to the display area 1 of the panel to control the display.

FIGS. 2A and 2B are schematic illustrations showing an ACF being hot-pressed in a conventional method of aligning leads with bonding pads. As shown in FIGS. 2A, 2B and 1, conductive particles 413 distributed in an adhesive 411 of the first ACF 41 can be resin balls serving as cores covered by a conductive metal material such as gold and nickel. After the second substrate 21 and the first substrate 11 are hot-pressed, the second electrode (i.e., the conventional lead) 22 and the first electrode (i.e., the conventional bonding pad) 13 may be electrically connected to each other through the conductive particles 413.

As shown in FIG. 2B, the conventional leads and the bonding pads are aligned with and bonded to each other in a one-to-one manner. When the ACF having the adhesive is hot-pressed, a good adhesive overflowing path is required to prevent the cured adhesive on the bonding surface from having the bonding defect of the non-uniform thickness due to the poor overflowing adhesive. FIG. 3 is a schematic illustration showing a main adhesive overflowing path of the adhesive in the conventional method of aligning the leads with the bonding pads. In the conventional method of aligning the leads with the bonding pads, the adhesive overflows into spacing between two adjacent leads (second electrodes 22) and two adjacent bonding pads (first electrodes 13), and the adhesive overflowing path is indicated by the arrows of FIG. 3. The conventional aligning design is practicable for the leads (bonding pads) having the smaller widths. However, the poor overflowing adhesive becomes a serious problem when the conventional aligning design is used in the leads (bonding pads) having larger widths because the leads and the bonding pads are bonded over a large area and the adhesive closer to the center of the contact surface cannot flow out easily.

FIG. 4 is a schematic illustration showing the poor overflowing adhesive produced using the conventional method to align bonding leads with bonding pads over a large area. As shown in FIG. 4, the areas of the lead and the bonding pad are large, the poor overflowing adhesive 411 after being hot-pressed electrically connects the second substrate 21 to the first substrate 11 only through the conductive particles 413' close to the outer sides of the lead (second electrode 22) and the bonding pad (first electrode 13) to achieve the object of electrical connection. Thus, the problem of poor electrical connection may be caused. Furthermore, the redundant adhesive 411 after reaction and curing between the lead and the bonding pad results in poor bonding intensity between the lead (second electrode 22) and the bonding pad (first electrode 13), and the repeated twitching or bending during the module assembly process may peel off the lead (second electrode 22) and the bonding pad (first electrode 13).

SUMMARY OF THE INVENTION

It is therefore an object of the invention to provide a signal transmission assembly and a display device applied with the same in order to improve the uniformity of the adhesive overflowing and the bonding intensity of the film substrate.

The invention achieves the above-identified object by providing a signal transmission assembly. The assembly includes a first substrate having a first electrode, a second substrate having a second electrode, and a conductive layer. The second electrode at least has a trench. The conductive layer is disposed between the first electrode and the second electrode. The conductive layer includes an adhesive and numerous conductive particles distributed in the adhesive. The second electrode is electrically connected to the first electrode through the conductive layer, and a portion of the adhesive is filled into the trench of the second electrode.

The invention also achieves the above-identified object by providing a display device including a display panel, a second substrate and a conductive layer. The display panel includes a display area and a non-display area. The display panel has a first substrate having a first electrode thereon. The first electrode is located in the non-display area and electrically connected to the display area. One end of the second substrate has a second electrode. The second electrode at least has a trench.

The conductive layer is located between the first electrode and the second electrode. The conductive layer includes an adhesive and numerous conductive particles distributed in the adhesive. The second electrode is electrically connected to the first electrode through the conductive layer, and a portion of the adhesive is filled into the trench of the second electrode.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a signal transmission assembly and a display device applied with the same. One trench or multiple trenches are formed on a lead or leads at a bonding portion to provide an adhesive overflowing path so that the overflowing adhesive uniformity after bonding and the bonding intensity can be enhanced.

Figure 1:
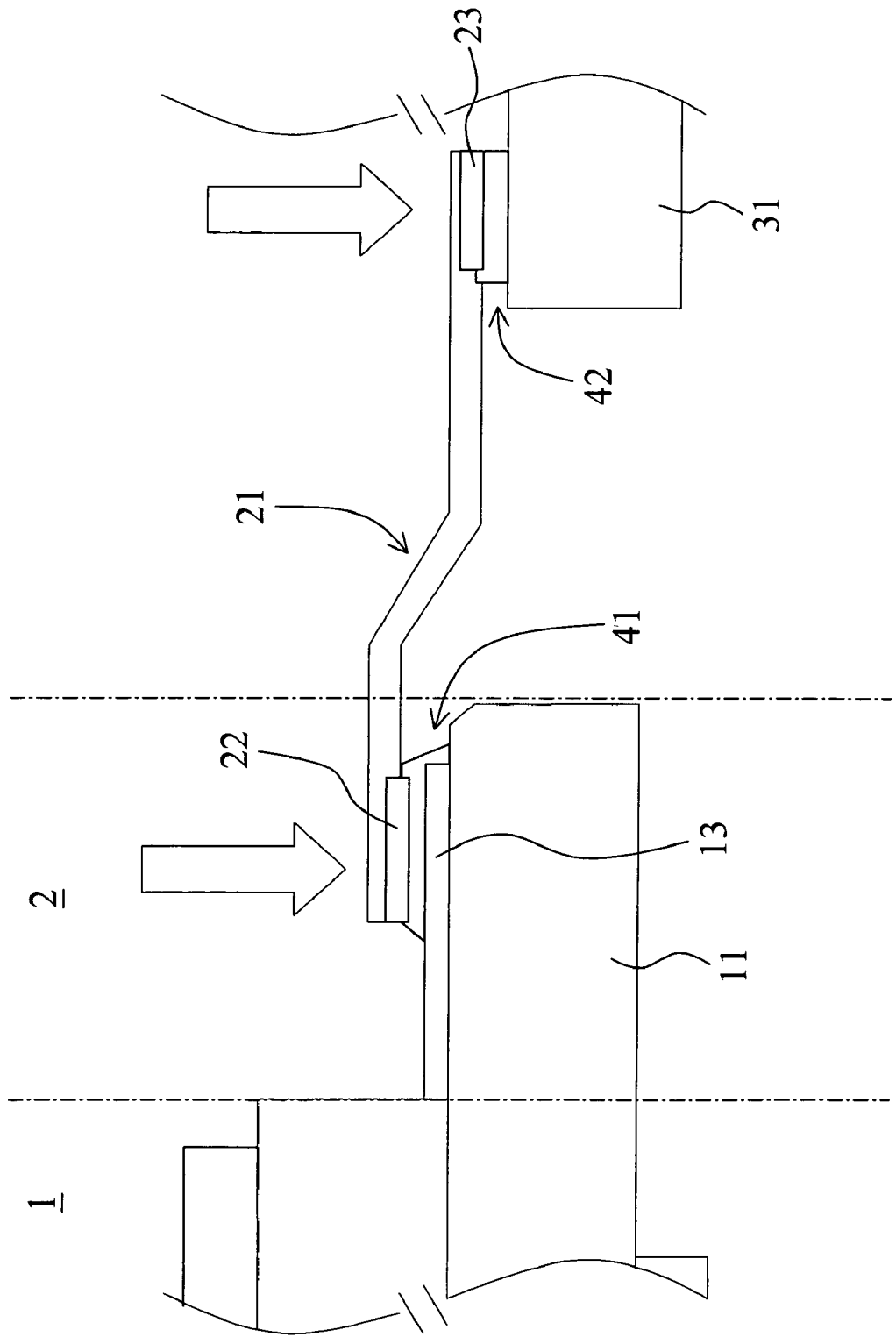
FIG. 1 (Prior Art) is a schematic illustration showing a display panel in which a PCB is connected to a display panel through a FPC.
Figure 5:
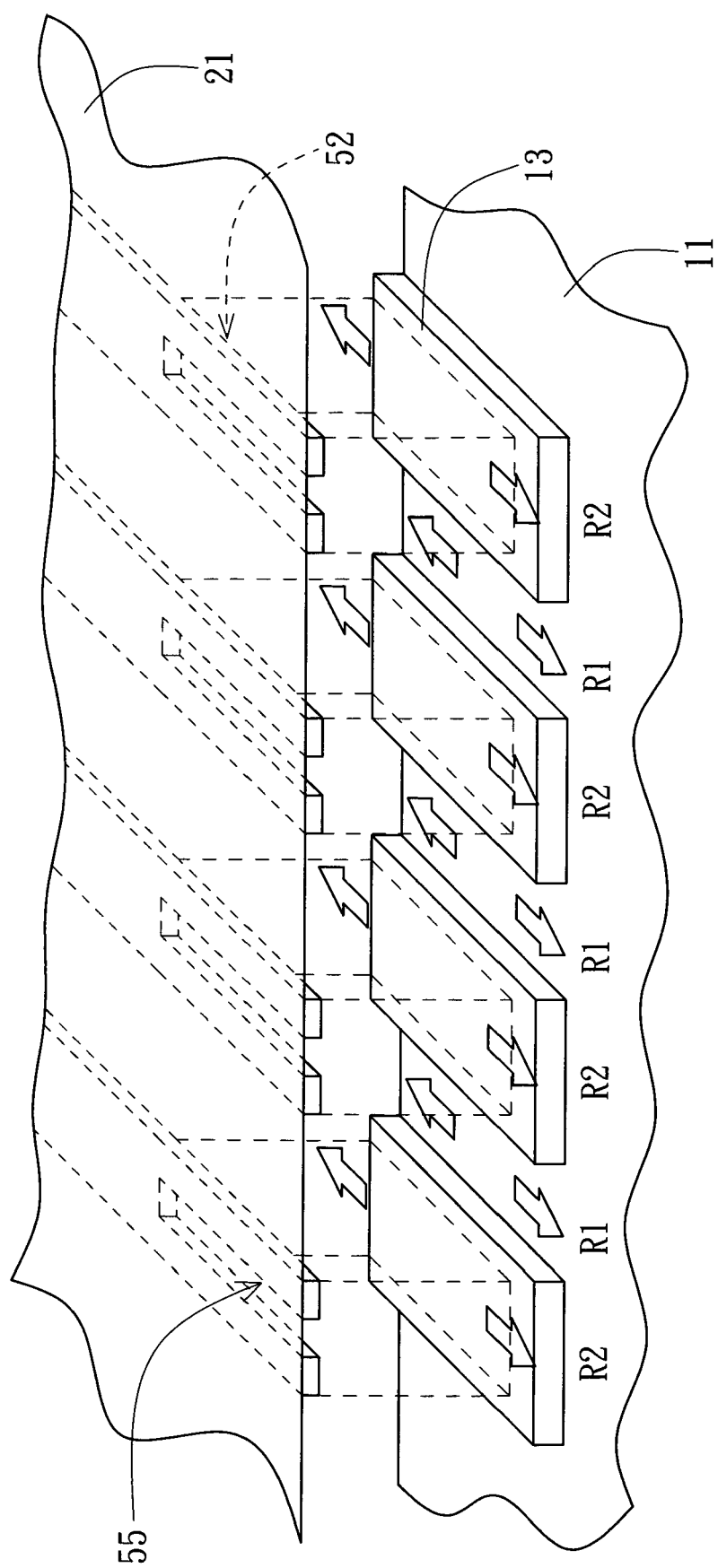
FIG. 5 is a schematic illustration showing the way of aligning leads with bonding pads and a main adhesive overflowing path according to a preferred embodiment of the invention.

FIG. 5 is a schematic illustration showing the way of aligning leads with bonding pads and a main adhesive overflowing path according to a preferred embodiment of the invention. In addition, the structure, in which a third substrate, such as a PCB (Print Circuit Board), is connected to the first substrate (e.g., a glass substrate) of a display panel through the second substrate (e.g., a FPC) in the display device, is shown in FIG. 1. The same symbols in FIGS. 5 and 1 denote the same elements.

Figure 2A:
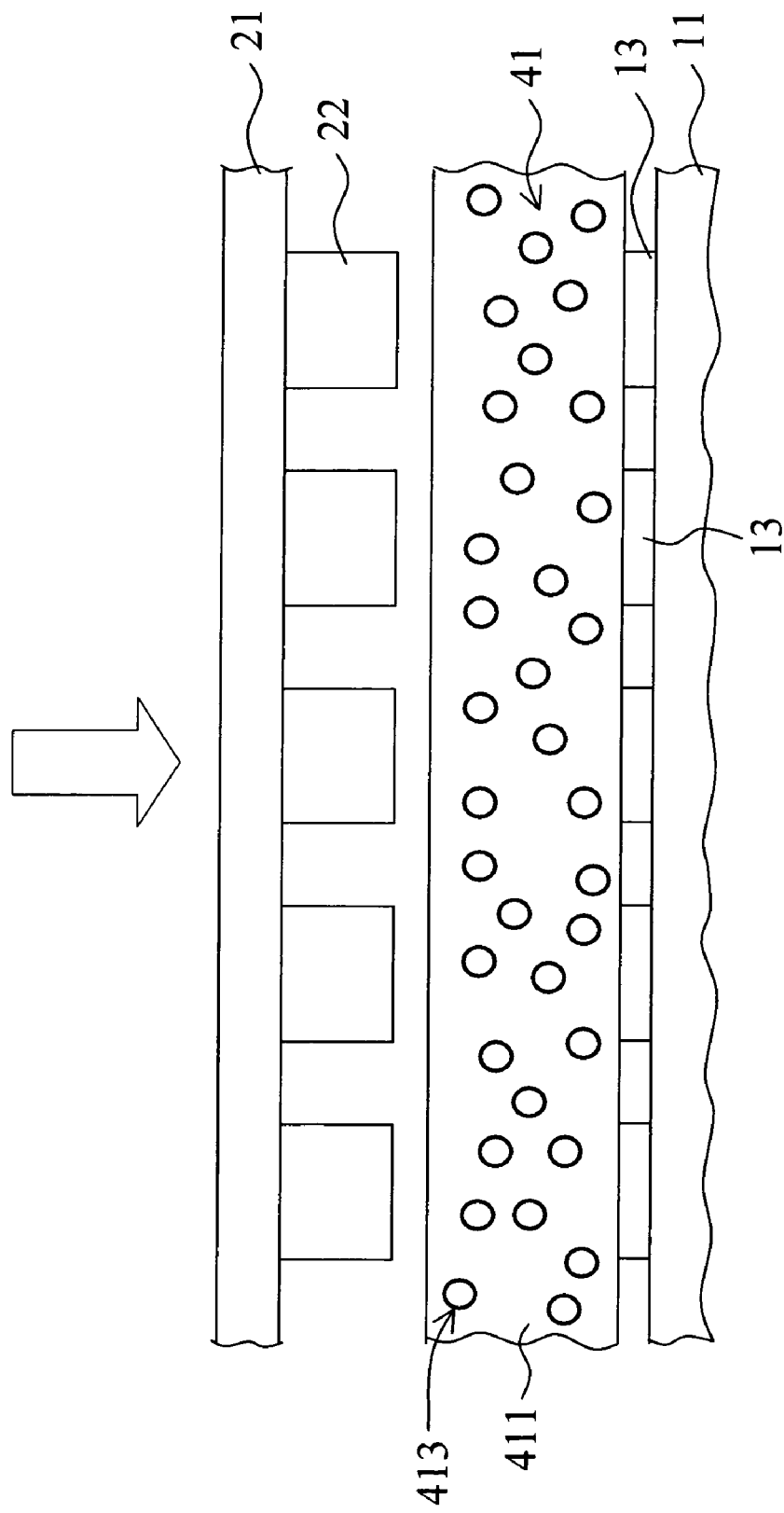
FIGS. 2A and 2B (Prior Art) are schematic illustrations showing an ACF being hot-pressed in a conventional method of aligning leads with bonding pads.
Figure 2B:
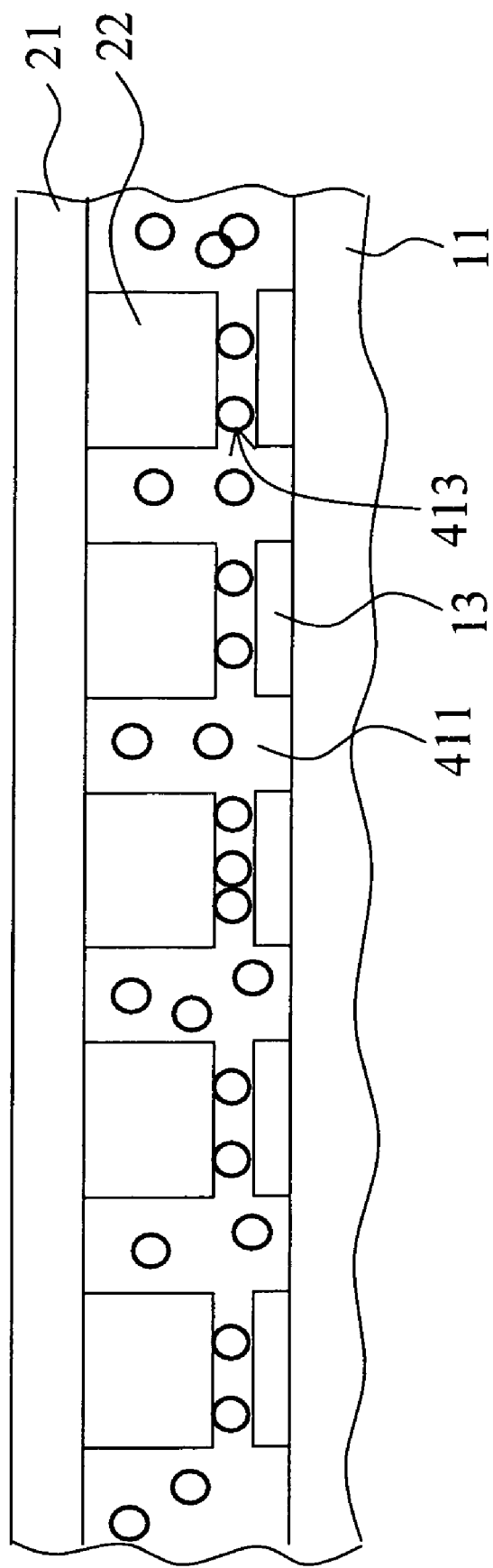
Figure 3:
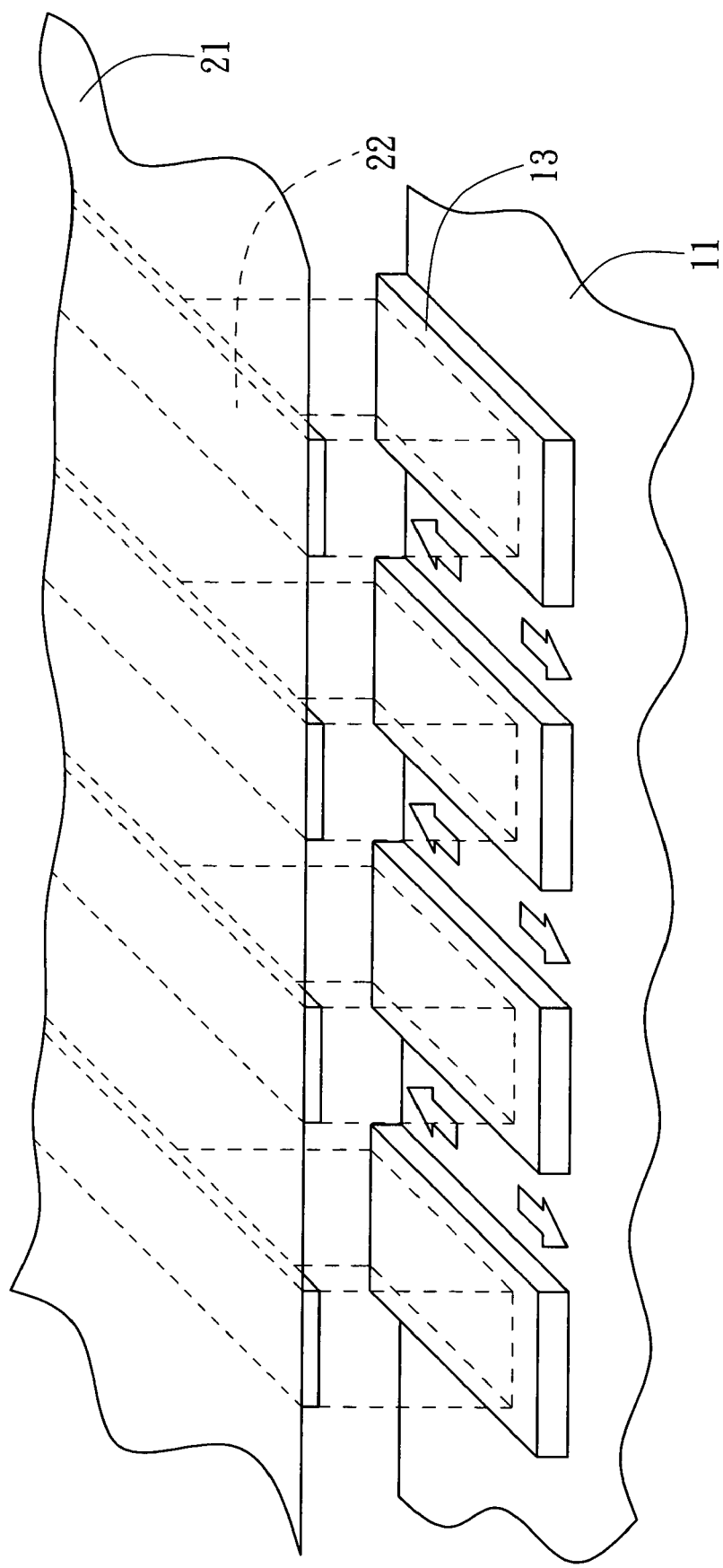
FIG. 3 (Prior Art) is a schematic illustration showing a main adhesive overflowing path of the adhesive in the conventional method of aligning the leads with the bonding pads.
Figure 4:
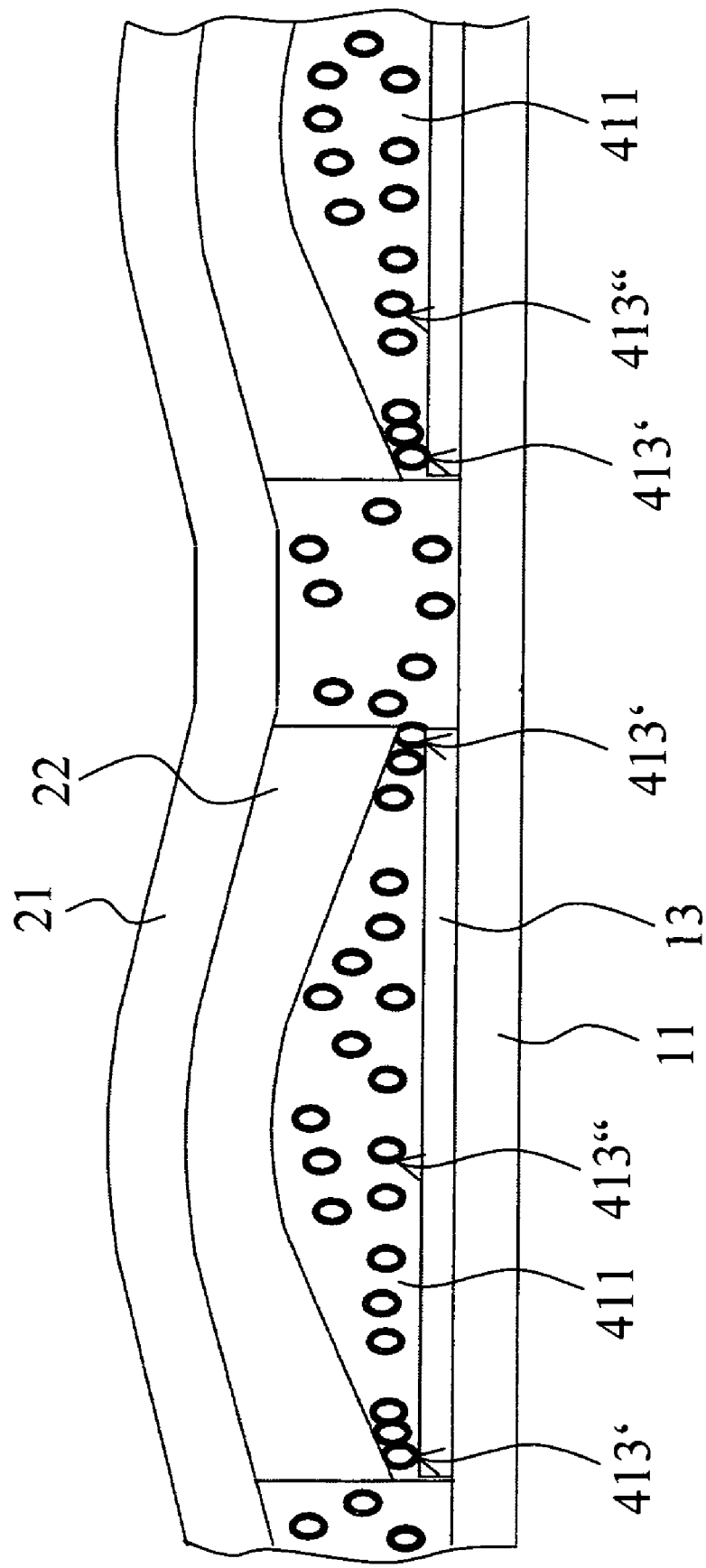
FIG. 4 (Prior Art) is a schematic illustration showing the poor overflowing adhesive produced using the conventional method of aligning bonding leads with bonding pads over a large area.

Referring to FIG. 5, the signal transmission assembly of the invention includes the first substrate 11 having the first electrode 13, the second substrate 21 having the second electrode 52, and a conductive layer (not shown). Each second electrode 52 has at least one trench 55, and the conductive layer is disposed between the first electrode 13 and the second electrode 52. The relative position may be found in FIG. 1. The conductive layer, such as an ACF (Anisotropic Conduction Film), includes an adhesive and numerous conductive particles distributed in the adhesive (see FIGS. 2A and 2B). After the second substrate 21 and the first substrate 11 are hot-pressed, the second electrode 52 is electrically connected to the first electrode 13 through the conductive layer, and a portion of the adhesive of the conductive layer is filled into the trench 55 of the second electrode 52. Spacing between adjacent second electrodes 52 can provide adhesive overflowing paths, as indicated by arrows R1. In addition, the trenches 55 on the second electrode 52 may also provide the adhesive overflowing paths, as indicated by arrows R2. Thus, when the invention is applied to the lead (i.e., second electrode) and the bonding pad (i.e., first electrode), both having width greater than or equal to 150 μm, the overflowing adhesive uniformity can be enhanced, and the problem of poor overflowing adhesive in the prior art can be avoided.

Figure 6:
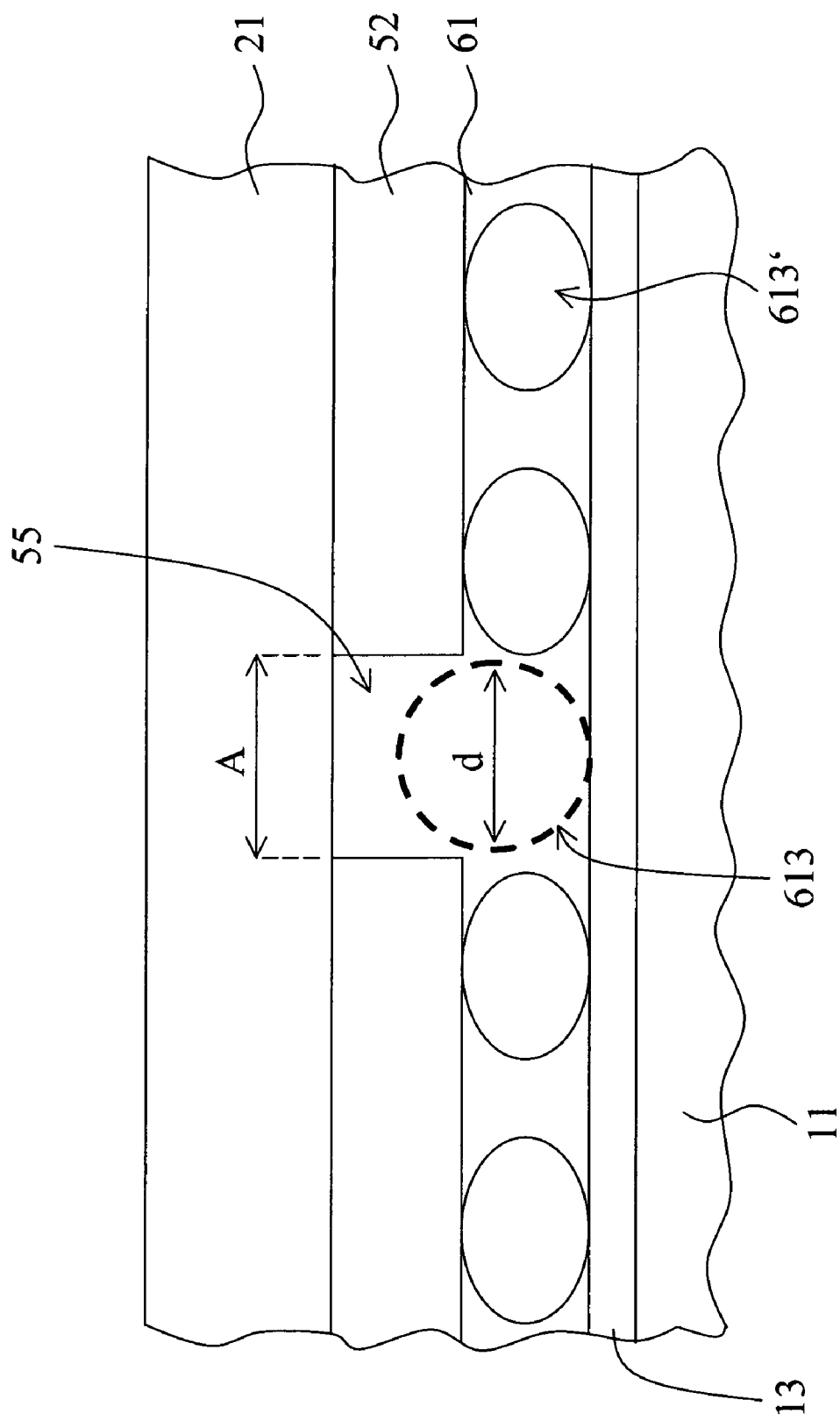
FIG. 6 is a schematic illustration showing a slit, which is a trench of the second electrode according to the embodiment of the invention.
Figure 7:
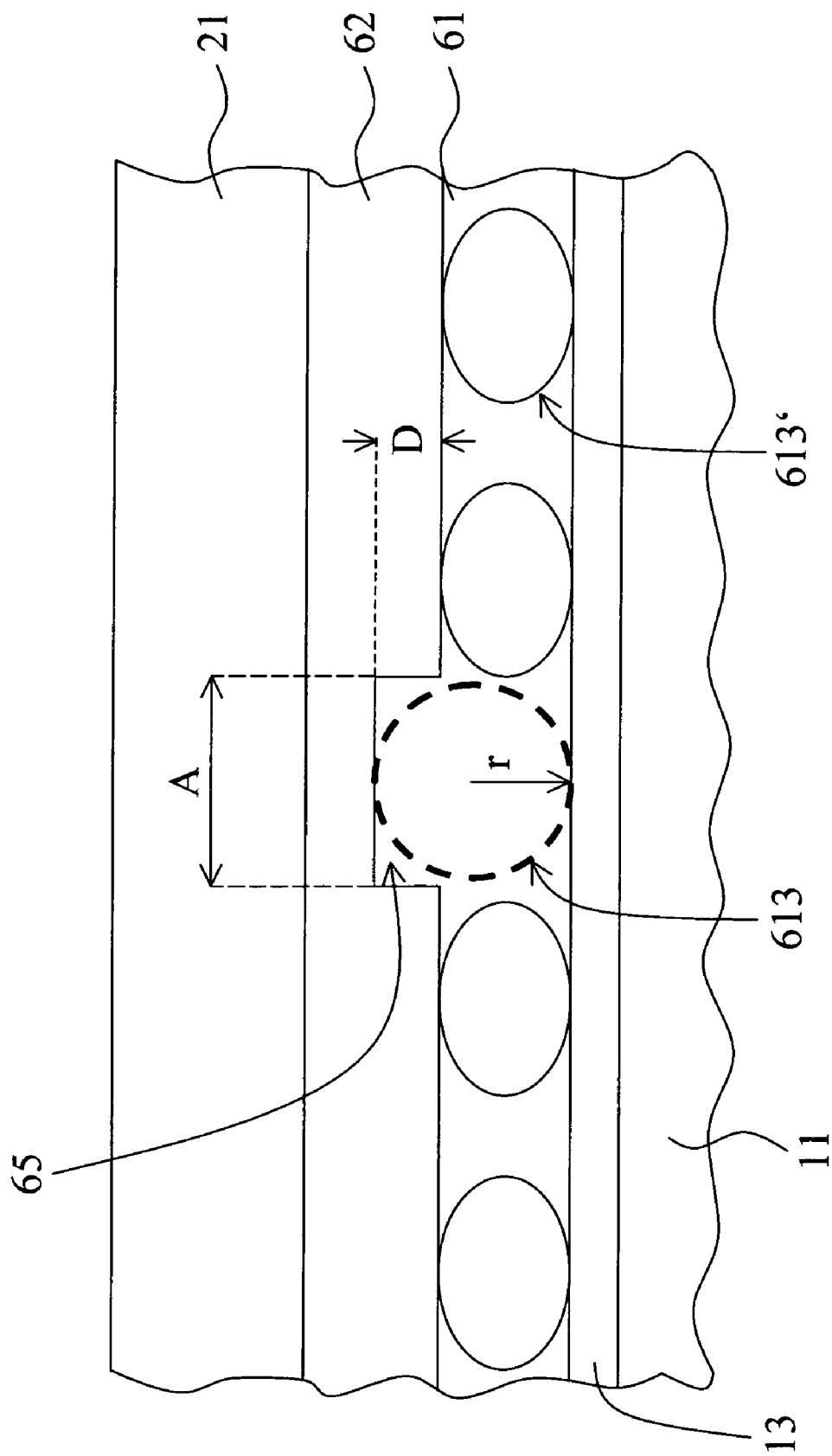
FIG. 7 is a schematic illustration showing a recess, which is the trench of the second electrode according to the embodiment of the invention.

Although the trench 55 on the second electrode 52 in FIG. 5 is completely cut through to form a slit, it is appreciated that the invention is not limited thereto. The trench 55 on the second electrode 52 may be a recess. FIGS. 6 and 7 are schematic illustrations respectively showing a slit and a recess, each of which is an example of the trench of the second electrode according to the embodiment of the invention.

When the trench of the second electrode is a slit, as shown in FIG. 6, the second electrode 52 on the second substrate 21 is electrically connected to the first electrode 13 on the first substrate 11 through conductive particles 613' in a conductive layer 61 after being hot-pressed. The width A of the trench 55 has to be large enough to allow one conductive particle 613 to pass through. Thus, the width A is greater than a diameter d of the conductive particle 613 before being hot-pressed.

When the trench of the second electrode is a recess, as shown in FIG. 7, the second electrode 62 on the second substrate 21 is electrically connected to the first electrode 13 on the first substrate 11 through the conductive particles 613' in the conductive layer 61 after being hot-pressed. In addition to that the width A of the recess 65 has to be greater than a diameter (2r) of the conductive particle 613, the depth D of the recess 65 after being pressed has to allow at least one conductive particle 613 to pass through. Assume that the conductive particle 613' is compressed and deformed for 50% of the original size, the depth D of the recess 65 has to be greater than the radius r of the conductive particle 613.

Of course, when the invention is actually applied, the trench on the second electrode is not limited to the type as shown in FIG. 5. One or more than one trench may be formed, and the trench may be a longitudinal trench or a transversal trench. If the trench is the longitudinal trench, the length of the trench may be equal to or greater than the length of the second electrode. Furthermore, one end of the trench may reach a side edge of the second electrode such that the second electrode has a fork-like shape, a herringbone shape or any other shape. Hereinafter, eight types of the second electrodes capable of enhancing the overflowing adhesive uniformity are illustrated when the invention is actually used.

FIGS. 8A to 8H are schematic illustrations showing eight types of the second electrode according to the embodiment of the invention. FIG. 9 is a schematic illustration showing a structure of a FPC (Flexible Print Circuit). The FPC 9 is mainly composed of the first polymeric layer 91, the second polymeric layer 92 and a conductive composite layer 93. The exposed G or H end of the conductive composite layer 93 may serve as the second electrode 52. FIGS. 8A to 8H are depicted when viewed from the first polymeric layer 91 of FIG. 9 to the second polymeric layer 92, wherein the first polymeric layer 91 corresponds to the substrate 21 in FIGS. 8A to 8H. In order to illustrate the features of the invention clearly, FIGS. 8A to 8H only show the portions associated with the second electrode 52, while the dashed lines P2 in FIGS. 8A to 8H represent a front edge portion of the second polymeric layer 92 of FIG. 9.

Figure 8B:
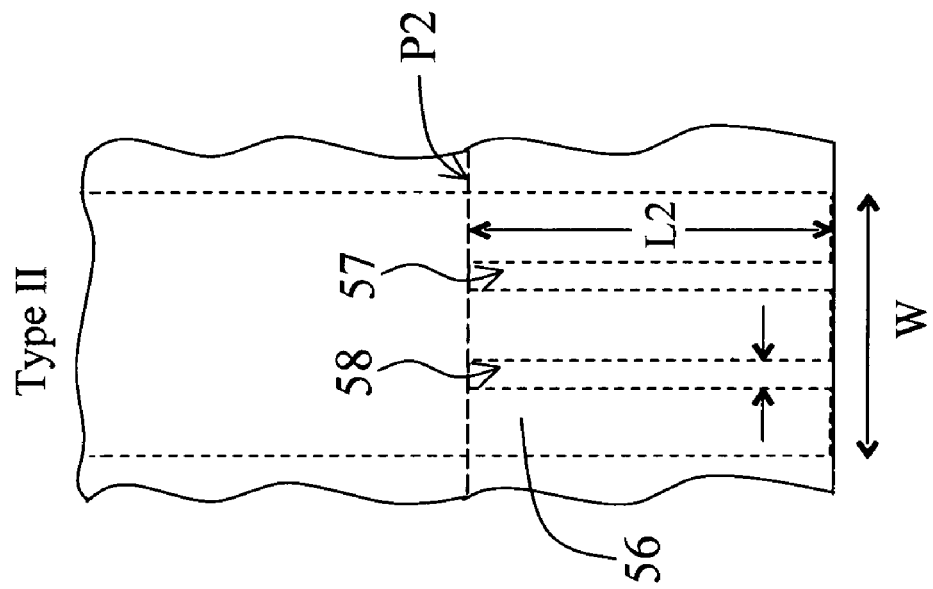
FIGS. 8A and 8B are schematic illustrations showing type I and type II of the second electrode according to the embodiment of the invention.
Figure 8A:
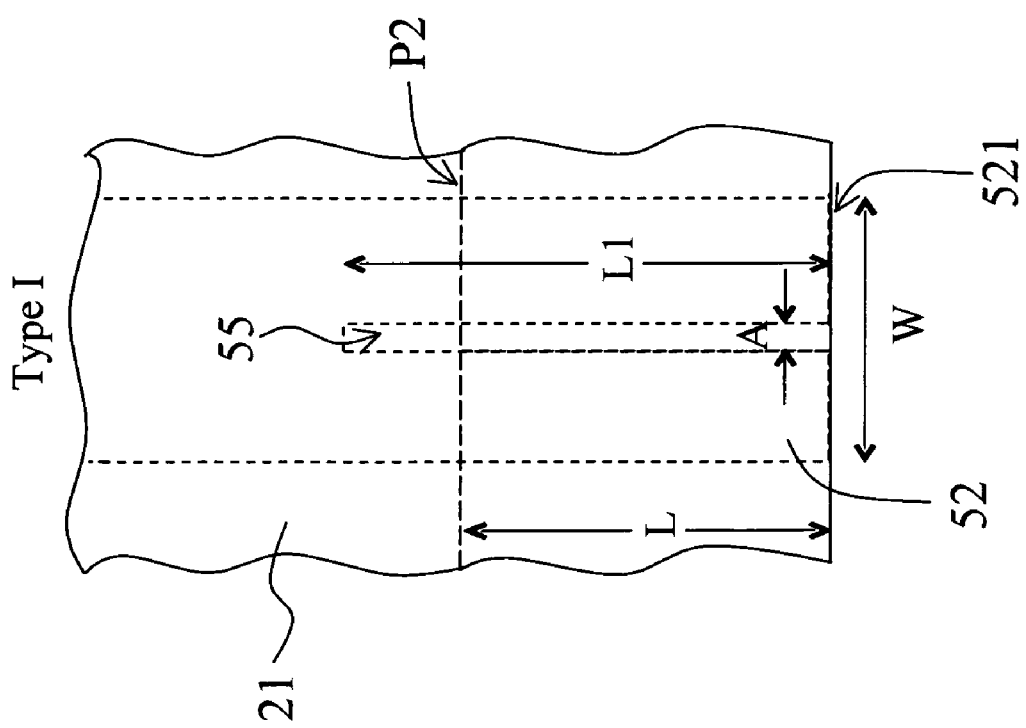
Figure 9:
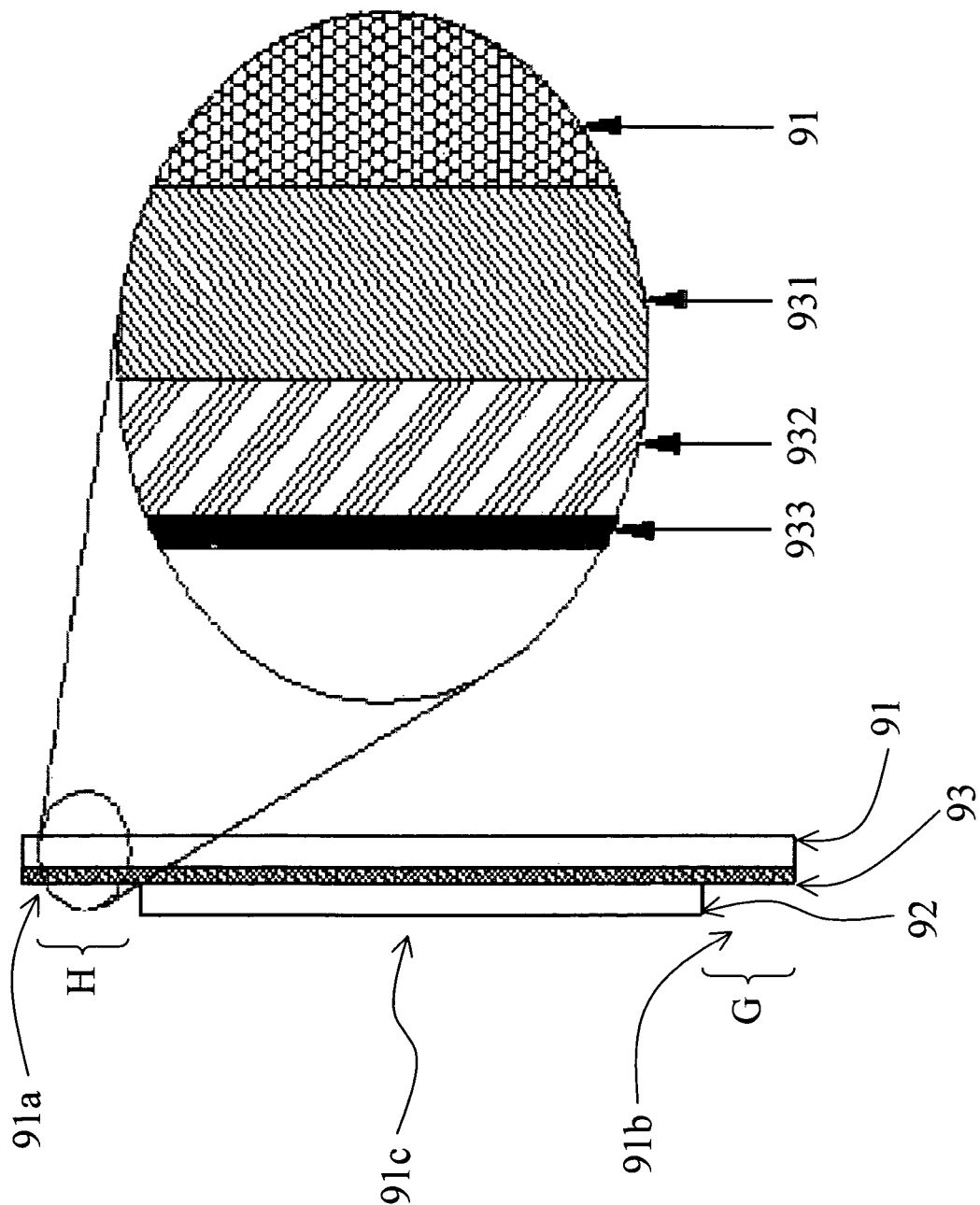
FIG. 9 is a schematic illustration showing a structure of a FPC (Flexible Print Circuit).

FIGS. 8A and 8B are schematic illustrations showing type I and type II of the second electrode according to the embodiment of the invention. The second electrodes 52 in FIGS. 8A and 5 are the same longitudinal trench 55, and one end of the trench 55 reaches a front edge 521 of the second electrode 52 such that the second electrode 52 has the fork-like shape. Furthermore, the length L1 of the trench 55 is greater than or equal to the length L of the second electrode 52. The difference between FIGS. 8B and 8A is that the second electrode 56 of FIG. 8B has a number of longitudinal trenches 57 and 58. The length L2 of each of the trenches 57 and 58 is greater than or equal to the length L of the second electrode 52. In addition, the width A of each of the trenches 55, 57 and 58 in FIGS. 8A and 8B is greater than the diameter of one conductive particle. In order to prevent the increasing of the bonding impedance, the second electrodes 52 and 56 with the trenches 55 and trenched 57 and 58, respectively, need to be formed to have enough electrode portion. That is, the width W of the second electrode 52 or 56 has to be limited to be higher than a minimum level. In addition, under the limitation of the alignment precision of the machine, the width W in this preferred embodiment has to be greater than 150 μm. However, the width W cannot be too great. Great width W can increase the cost of manufacturing the film substrate.

Figure 8D:
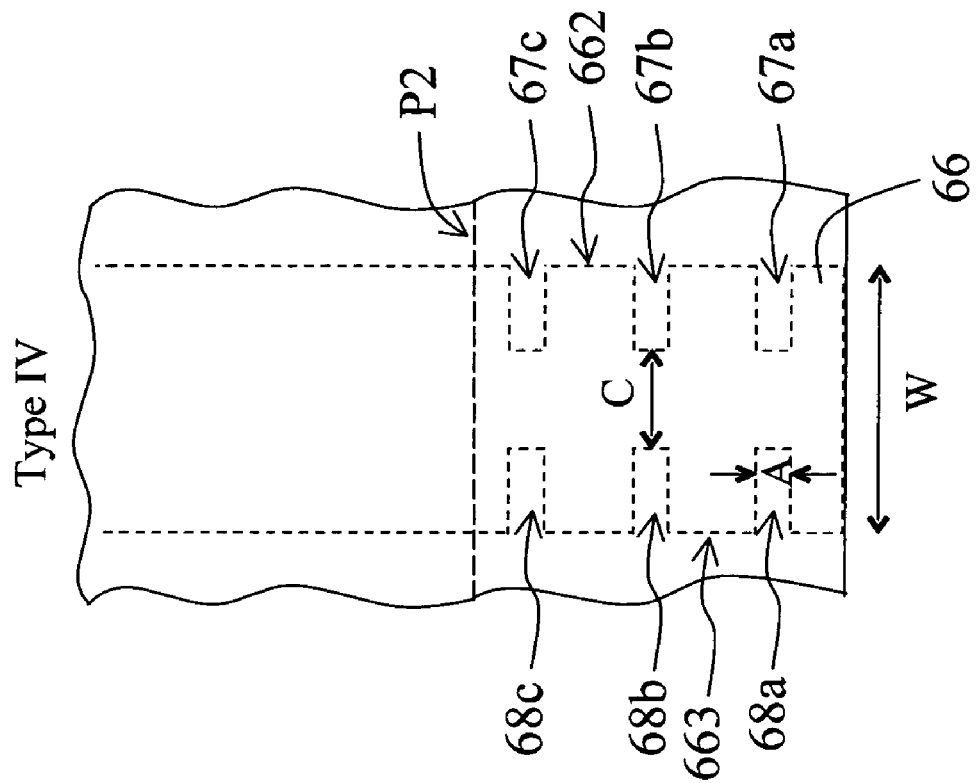
FIGS. 8C and 8D are schematic illustrations showing type III and type IV of the second electrode according to the embodiment of the invention.
Figure 8C:
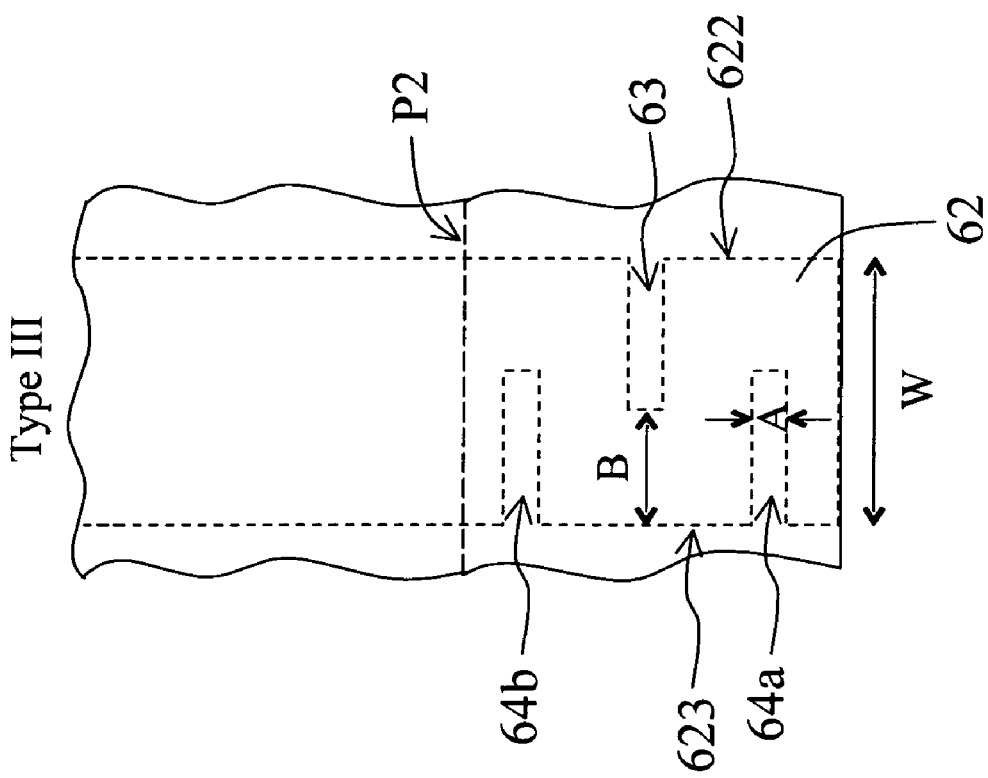

FIGS. 8C and 8D are schematic illustrations showing type III and type IV of the second electrode according to the embodiment of the invention. In FIG. 8C, the second electrode 62 has a number of transversal trenches arranged in a staggered manner. The trenches include a trench 63 having one end reaching a side edge 622 of the second electrode 62, and trenches 64a and 64b each having one end reaching a side edge 623. Furthermore, the three trenches 63, 64a and 64b are staggered. However, it is required that these transversal trenches 63, 64a and 64b are formed in a manner that the residual width B of the second electrode 62 is large enough so that open-circuit and the impedance increase are avoided. In this preferred embodiment, the residual width B of the second electrode has to be greater than or equal to 10 μm. In FIG. 8D, the second electrode 66 has a number of transversal trenches arranged in a symmetrical manner. Each of the trenches 67a, 67b and 67c has one end reaching a side edge 662, and similarly, each of the trenches 68a, 68b and 68c has one end reaching a side edge 663. The second electrode in FIG. 8D differs from that in FIG. 8C in that the trenches 67a, 67b and 67c at the right-hand side of FIG. 8D are arranged opposite to the trenches 68a, 68b and 68c at the left-hand side. Similarly, the small residual width C of the second electrode 66 may cause the open circuit and increase the impedance. So, the residual width C must be limited to a level that is higher than a minimum level. Taking the trenches 67b and 68b in this preferred embodiment as an example, the residual width C of the second electrode after being cut through is greater than or equal to 10 μm. In addition, the width A of each of the trenches 63, 64a, 64b, 67a, 67b, 67c, 68a, 68b and 68c in FIGS. 8C and 8D are also greater than the diameter of one conductive particle. In order to prevent increasing of the bonding impedance, the second electrodes 62 and 66 need to have enough electrode portion. Consequently, the width W of the second electrode 62 or 66 has to be limited to a level that is higher than a minimum level. However, the width W cannot be too great. Great width W will increase the cost of manufacturing the film substrate.

Figure 8F:
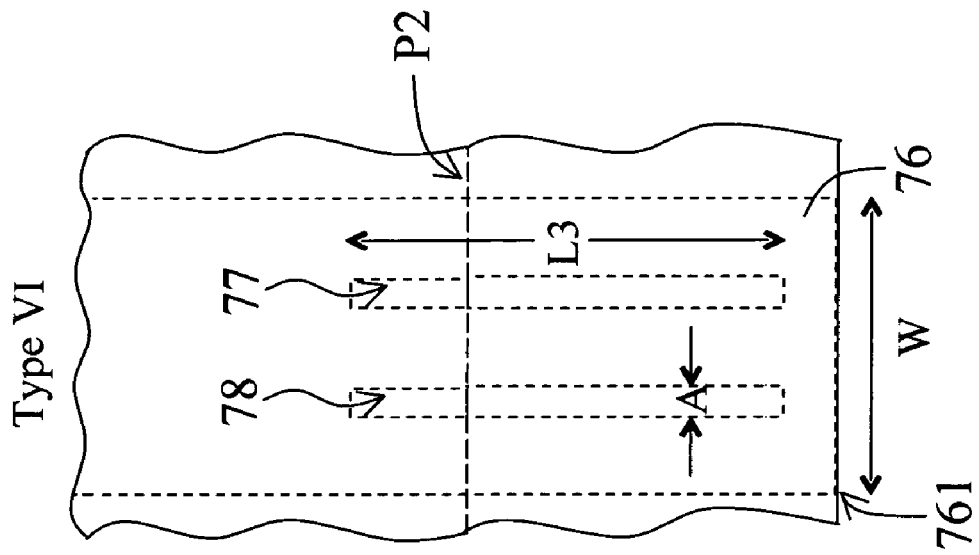
FIGS. 8E and 8F are schematic illustrations showing type V and type VI of the second electrode according to the embodiment of the invention.
Figure 8E:
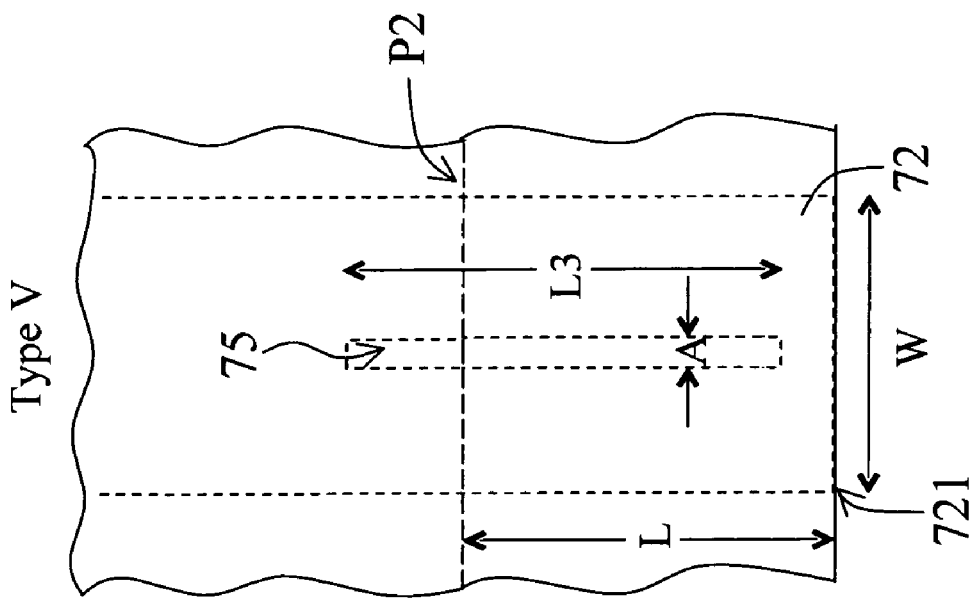

FIGS. 8E and 8F are schematic illustrations showing type V and type VI of the second electrode according to the embodiment of the invention. In FIG. 8E, a longitudinal trench 75 is formed on the second electrode 72. However, one end of the trench 75 does not reach a front edge 721 of the second electrode 72. The second electrode 76 of FIG. 8F differs from that of the second electrode 72 of FIG. 8E in that it has two longitudinal trenches 77 and 78. The same features of FIGS. 8F and 8E include that one end of each of the trenches 75 and 77 and 78 does not reach a front edge 721 and 761 of the second electrode 72 and 76 and the other end of each of the trenches 75, 77 and 78 extends over dash line P2. That is, the trenches 75, 77 and 78 extend to an extent between the first polymeric layer 91 and the second polymeric layer 92 as shown in FIG. 9. In addition, the width A of each of the trenches 75, 77 and 78 in FIGS. 8E and 8F is greater than the diameter of one conductive particle. The width W of each of the second electrodes 72 and 76 has to be greater than 150 μm in this preferred embodiment in order to have the enough bonding area.

Figure 8H:
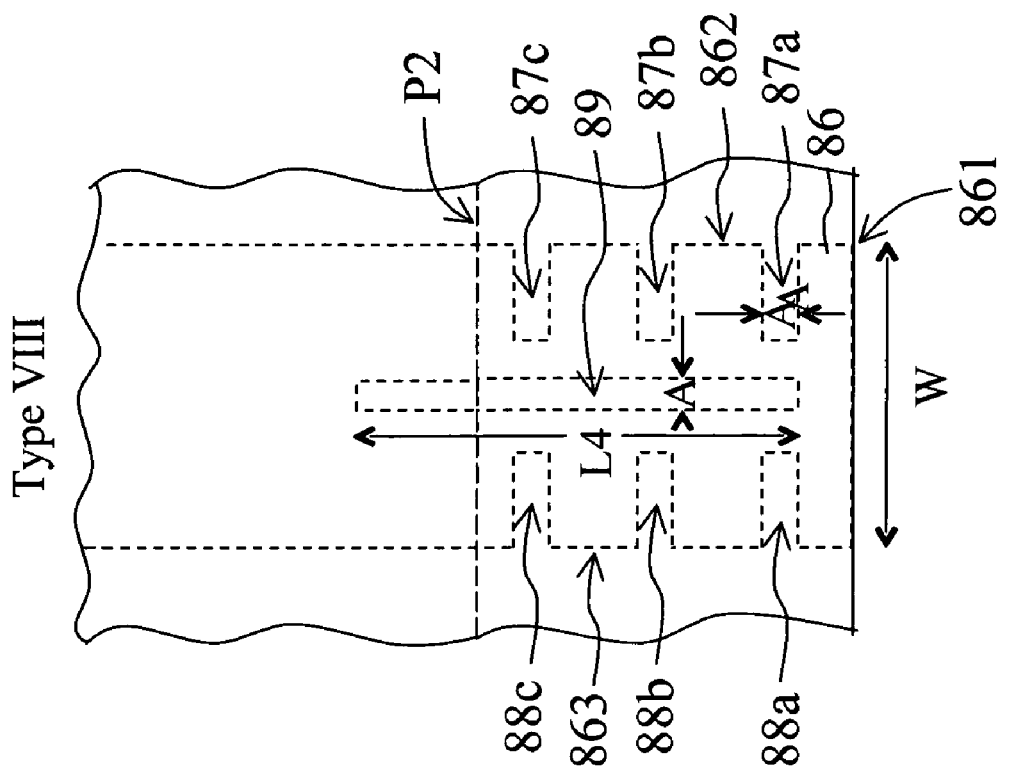
FIGS. 8G and 8H are schematic illustrations showing type VII and type VIII of the second electrode according to the embodiment of the invention.
Figure 8G:
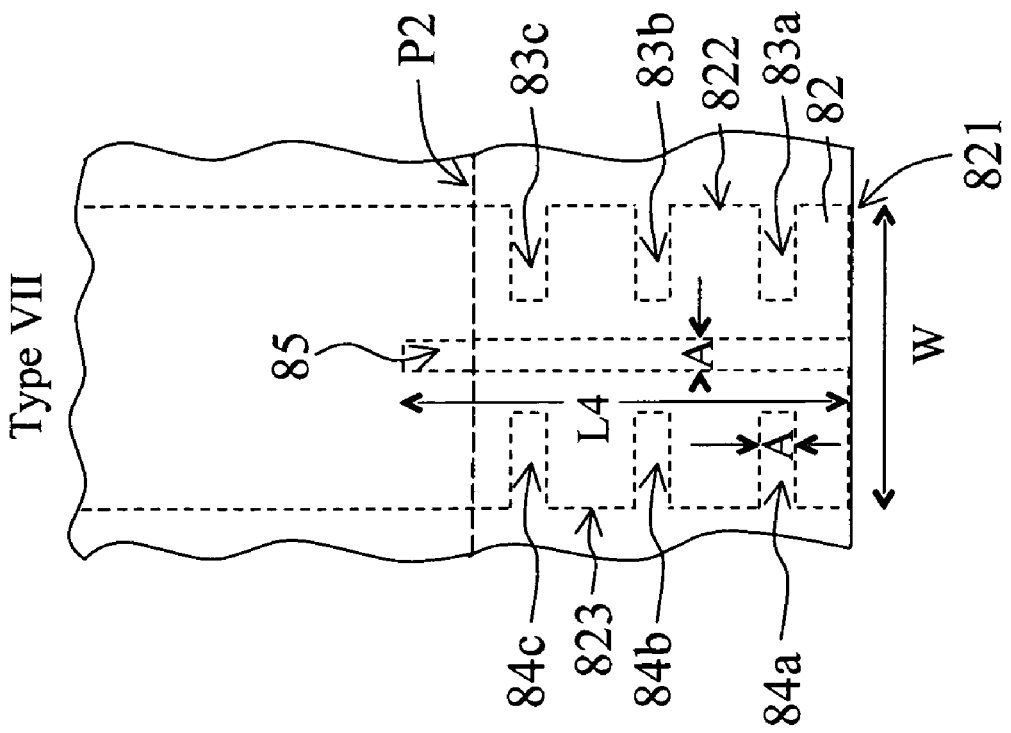

FIGS. 8G and 8H are schematic illustrations showing type VII and type VIII of the second electrode according to the embodiment of the invention. The type VII is shown in FIG. 8G, in which the second electrode 82 has a longitudinal trench 85 and a number of transversal trenches 83a, 83b, 83c, 84a, 84b and 84c, and ends of the trenches respectively reach a front edge 821 and side edges 822 and 823 of the second electrode 82. The type VIII is shown in FIG. 8H. The difference between FIGS. 8H and 8G is that one end of a longitudinal trench 89 of type VIII as shown in FIG. 8H does not reach a front edge 861 of the second electrode 86. However, the same feature of FIGS. 8G and 8H includes that one end of each of the trenches 85 and 89 extends over dash line P2. That is, the trenches 85 and 89 extend to an extent between the first polymeric layer 91 and the second polymeric layer 92 as shown in FIG. 9. In addition, the width A of each of the trenches 83a, 83b, 83c, 84a, 84b, 84c, 85, 87a, 87b, 87c, 88a, 88b, 88c and 89 in FIGS. 8G and 8H has to be greater than the diameter of one conductive particle. The widths W of the second electrodes 82 and 86 also have to be greater than 150 μm in order to have the enough bonding area in this preferred embodiment.

When the invention is actually applied to a display device, the second substrate 21 may be, for example, a FPC. After being hot-pressed, two ends of the second substrate 21, including the second electrode 22 and the third electrode 23, are bonded to the first substrate 11 and the third substrate 31, respectively, to complete the electrical connection between the first substrate 11 and the third substrate 31 such that signals can be transmitted therebetween. The schematic illustration after bonding is shown in FIG. 1. Although the second electrode is illustrated as an example in the above-mentioned embodiment, the invention may also be applied to the other end of the second substrate 21. That is, one trench or multiple trenches may be formed at the third electrode 23 to enhance the overflowing adhesive uniformity and increase the bonding intensity between the second substrate 21 and the third substrate 31.

The invention can be applied onto a signal transmission structure, such as FPC (Flexible Print Circuit). The signal transmission structure includes the first passivation layer 91, the second passivation layer 92 and a conductive composite layer 93. The second passivation layer 92 is disposed opposite to the first passivation layer 91 to form an exposed region 91a, 91b and an unexposed region 91c on the structure. The conductor layer 93, formed between the first passivation layer 91 and the second passivation layer 92, is disposed on the exposed region 91a, 91b and extends onto the unexposed region 91c. The conductor layer 93 in the exposed region has a trench, an overall width of the conductor layer 93 on the exposed region 91a, 91b is substantially equal to an overall width of the conductor layer 93 on the unexposed region 91c. The pressed area of the conductor layer 93 on the exposed region 91a, 91b is smaller than the area of the conductor layer 93 on the unexposed region 91c.

FIG. 9 is a schematic illustration showing a structure of a FPC (Flexible Print Circuit). The FPC 9 is mainly composed of the first polymeric layer 91, the second polymeric layer 92 and a conductive composite layer 93. The polymeric layers are made of polyimide. The conductive composite layer 93 is disposed between the first polymeric layer 91 and the second polymeric layer 92. The conductive composite layer 93 can be, for example, a copper layer 931 plated with a nickel layer 932 and a gold layer 933. The length of the conductive composite layer 93 is substantially equal to that of the first polymeric layer 91 but greater than that of the second polymeric layer 92. Thus, the two ends G and H of the conductive composite layer 93 may be exposed to form the leads (i.e., the second electrode 22 and the third electrode 23).

Although the FPC may serve as the second substrate 21, the invention may also use any film substrate, which may be the TCP/TAB or COF having the golden finger structure such that the film substrate after being aligned and pressed may have the enhanced overflowing adhesive uniformity and the increased bonding intensity.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal transmission assembly, comprising:
   a first substrate having a first electrode;
   a second substrate having a second electrode, the second electrode having a trench; and
   a conductive layer, which is disposed between the first electrode and the second electrode and comprises an adhesive and a plurality of conductive particles distributed in the adhesive,
   wherein the second electrode is electrically connected to the first electrode through the conductive layer, the trench is covered by the first electrode, and a portion of the adhesive is filled into the trench.

2. The assembly according to claim 1, wherein a width of the trench is greater than a diameter of one of the conductive particles.

3. The assembly according to claim 1, wherein the trench is a recess having a depth greater than a radius of one of the conductive particles.

4. The assembly according to claim 1, wherein the trench is a slit.

5. The assembly according to claim 1, wherein the first substrate is a glass substrate, and the first electrode is a bonding pad.

6. The assembly according to claim 5, wherein the bonding pad comprises:
   a metal layer formed on the first substrate; and
   an Indium Tin Oxide (ITO) layer formed on the metal layer.

7. The assembly according to claim 1, wherein the second substrate is a TCP/TAB (Tape Carrier Package/Tape Automated Bonding), a COF (Chip On Film) or a FPC (Flexible Print Circuit), and the second electrode is a lead.

8. The assembly according to claim 7, wherein the FPC comprises a first polymeric layer, a second polymeric layer and a conductive composite layer disposed between the first and second polymeric layers, and a length of the second polymeric layer is smaller than the conductive composite layer to expose one end of the conductive composite layer to form the lead.

9. The assembly according to claim 8, wherein the other end of the conductive composite layer is also exposed to form a third electrode to be electrically connected to a third substrate.

10. The assembly according to claim 9, wherein the third substrate is a PCB (Print Circuit Board).

11. The assembly according to claim 1, wherein a width of the second electrode is greater than 150 μm.

12. The assembly according to claim 1, wherein the conductive layer is an ACF (Anisotropic Conduction Film).

13. A display device, comprising:
   a display panel comprising a display area and a non-display area, the display panel having a first substrate, the first substrate having a first electrode, which is disposed in the non-display area and electrically connected to the display area;
   a second substrate having one end formed with a second electrode, the second electrode having a trench; and
   a conductive layer, which is disposed between the first electrode and the second electrode, the conductive layer comprising an adhesive and a plurality of conductive particles distributed in the adhesive,
   wherein the second electrode is electrically connected to the first electrode through the conductive layer, the trench is covered by the first electrode, and a portion of the adhesive is filled into the trench.

14. The device according to claim 13, further comprising:
   a third substrate, which is electrically connected to the first substrate through the other end of the second substrate, wherein a signal of the third substrate is transmitted to the display area through the second substrate and the first electrode.

15. The device according to claim 14, wherein the second substrate is a TCP/TAB (Tape Carrier Package/Tape Automated Bonding), a COF (Chip On Film) or a FPC (Flexible Print Circuit) and comprises a first polymeric layer, a second polymeric layer and a conductive composite layer disposed between the first and second polymeric layers.

16. The device according to claim 15, wherein a length of the second polymeric layer is smaller than that of the conductive composite layer to expose two ends of the conductive composite layer to form the second electrode and a third electrode, respectively, and the third electrode is electrically connected to the third substrate.

17. The device according to claim 13, wherein a width of the trench of the second electrode is greater than a diameter of one of the conductive particles.

18. The device according to claim 13, wherein the trench of the second electrode is a recess having a depth greater than a radius of one of the conductive particles.

19. The device according to claim 13, wherein the trench of the second electrode is a slit.

20. The device according to claim 13, wherein the first substrate is a glass substrate and the first electrode is a bonding pad.

21. The device according to claim 13, wherein the third substrate is a PCB (Print Circuit Board).

22. The device according to claim 13, wherein a width of the second electrode is greater than 150 µm.

23. The device according to claim 13, wherein the conductive layer is an ACF (Anisotropic Conduction Film).

24. A signal transmission structure, comprising:
a first passivation layer;
a second passivation layer disposed opposite to the first passivation layer to form an exposed region and an unexposed region in the structure; and
a conductor layer, which is formed between the first passivation layer and the second passivation layer and disposed on the exposed region and extends onto the unexposed region, wherein
the conductor layer in the exposed region has a trench, an overall width of the conductor layer on the exposed region is substantially equal to an overall width of the conductor layer on the unexposed region, and a pressed area of the conductor layer on the exposed region is smaller than a area of the conductor layer on the unexposed region.

25. The structure according to claim 24, wherein the width of the conductor layer on the unexposed region is greater than 150 µm.

26. The structure according to claim 24, wherein after the signal transmission structure is pressed with a conductive layer, which comprises an adhesive and a plurality of conductive particles distributed in the adhesive, a portion of the adhesive is filled into the trench.

27. The structure according to claim 26, wherein a width of the trench is greater than a diameter of one of the conductive particles.

28. The structure according to claim 24, wherein the first passivation layer and the second passivation layer are respectively a first polymeric layer and a second polymeric layer, and the conductor layer is a metallic composite layer.

29. The structure according to claim 24, wherein the first passivation layer has a first length, the second passivation layer has a second length smaller than the first length such that the exposed region and the unexposed region are formed in the structure when the second passivation layer is disposed opposite to the first passivation layer.

30. A signal transmission assembly, comprising:
a first substrate having a first electrode;
a second substrate having a second electrode, the second electrode having a trench; and
a conductive layer, which is disposed between the first electrode and the second electrode and comprises an adhesive and a plurality of conductive particles distributed in the adhesive;
wherein the second electrode is electrically connected to the first electrode through the conductive layer, and a portion of the adhesive is filled into the second electrode trench;
wherein the second substrate is a TCP/TAB (Tape Carrier Package/Tape Automated Bonding), a COF (Chip On Film) or a FPC (Flexible Print Circuit), and the second electrode is a lead;
wherein the FPC comprises a first polymeric layer, a second polymeric layer, and a conductive composite layer disposed between the first and second polymeric layers, and the second polymeric layer has a length that is smaller than a length of the conductive composite layer whereby to expose one end of the conductive composite layer that forms the lead.

31. The assembly according to claim 30, wherein the other end of the conductive composite layer also is exposed so as to form a third electrode to be electrically connected to a third substrate.

32. The assembly according to claim 31, wherein the third substrate is a PCB (Print Circuit Board).

33. A display device, comprising:
a display panel comprising a display area and a non-display area, the display panel having a first substrate, the first substrate having a first electrode, which is disposed in the non-display area and is electrically connected to the display area;
a second substrate having one end formed with a second electrode, the second electrode having a trench;
a third substrate, which is electrically connected to the first substrate through the other end of the second substrate, wherein a signal is transmitted from the third substrate to the display area through the second substrate and the first electrode; and
a conductive layer, which is disposed between the first electrode and the second electrode, the conductive layer comprising an adhesive and conductive particles distributed in the adhesive,
wherein the second electrode is electrically connected to the first electrode through the conductive layer, and a portion of the adhesive is filled into the second electrode trench,
wherein the second substrate is a TCP/TAB (Tape Carrier Package/Tape Automated Bonding), a COF (Chip On Film) or a FPC (Flexible Print Circuit) and comprises a first polymeric layer, a second polymeric layer and a conductive composite layer disposed between the first and second polymeric layers, and
wherein a length of the second polymeric layer is smaller than that of the conductive composite layer to expose two ends of the conductive composite layer that form the second electrode and a third electrode, respectively, and the third electrode is electrically connected to the third substrate.

* * * * *